(12) United States Patent
Yamazaki et al.

(10) Patent No.: US 7,352,104 B2
(45) Date of Patent: Apr. 1, 2008

(54) SURFACE ACOUSTIC WAVE ELEMENT, METHOD OF MANUFACTURING THE SAME AND SURFACE ACOUSTIC WAVE DEVICE

(75) Inventors: Takashi Yamazaki, Suwa (JP); Keigo Iizawa, Suwa (JP)

(73) Assignee: Seiko Epson Corporation (JP)

( * ) Notice: Subject to any disclaimer, the term of this patent is extended or adjusted under 35 U.S.C. 154(b) by 200 days.

(21) Appl. No.: 11/010,014

(22) Filed: Dec. 10, 2004

(65) Prior Publication Data

US 2005/0127781 A1 Jun. 16, 2005

(30) Foreign Application Priority Data

| Dec. 12, 2003 | (JP) | ............... 2003-414210 |
| Dec. 19, 2003 | (JP) | ............... 2003-423153 |
| Aug. 23, 2004 | (JP) | ............... 2004-242806 |

(51) Int. Cl.
*H01L 41/08* (2006.01)

(52) U.S. Cl. ............... 310/313 A; 310/313 B; 310/313 D; 310/361

(58) Field of Classification Search ............ 310/313 R, 310/313 A, 313 B, 313 C
See application file for complete search history.

(56) References Cited

U.S. PATENT DOCUMENTS

| 3,974,463 A | | 8/1976 | Onodera |
| 4,223,286 A | * | 9/1980 | Ono et al. ................. 333/195 |
| 4,521,751 A | * | 6/1985 | Riha et al. ................. 333/151 |
| 4,916,348 A | * | 4/1990 | Beggs et al. ............ 310/313 D |
| 5,895,996 A | * | 4/1999 | Takagi et al. ........... 310/313 R |
| 6,316,861 B1 | * | 11/2001 | Ballandras et al. ..... 310/313 A |
| 2003/0030513 A1 | | 2/2003 | Yamazaki et al. |
| 2003/0052572 A1 | | 3/2003 | Iizawa et al. |

FOREIGN PATENT DOCUMENTS

| EP | 1 292 023 A2 | 3/2003 |
| EP | 1292023 | 3/2003 |
| WO | WO96/10293 | 4/1996 |

OTHER PUBLICATIONS

Communication from European Patent Office regarding counterpart application, no date given.
Communication from European Patent Office regarding counterpart application, no date given.

* cited by examiner

*Primary Examiner*—Mark Budd
(74) *Attorney, Agent, or Firm*—Harness, Dickey & Pierce, P.L.C.

(57) ABSTRACT

A surface acoustic wave element is provided including an IDT and reflectors provided on both sides of the IDT that are on a surface of a quartz plate. The quartz plate is made from an in-plane rotated ST cut quartz plate whose cutting angle is expressed as (0°, 113°-135°, ±(40°-49°)) by defining and using Euler angle. The IDT and reflectors are arranged at a slant of PFA±3° with respect to a direction of a phase velocity of a surface acoustic wave in the quartz plate. If the cutting angle of the quartz plate is expressed by the Euler angle (φ°, θ°, Ψ°), the power flow angle PFA is expressed that the PFA=0.374 (θ°−90°)−10.0°.

9 Claims, 8 Drawing Sheets

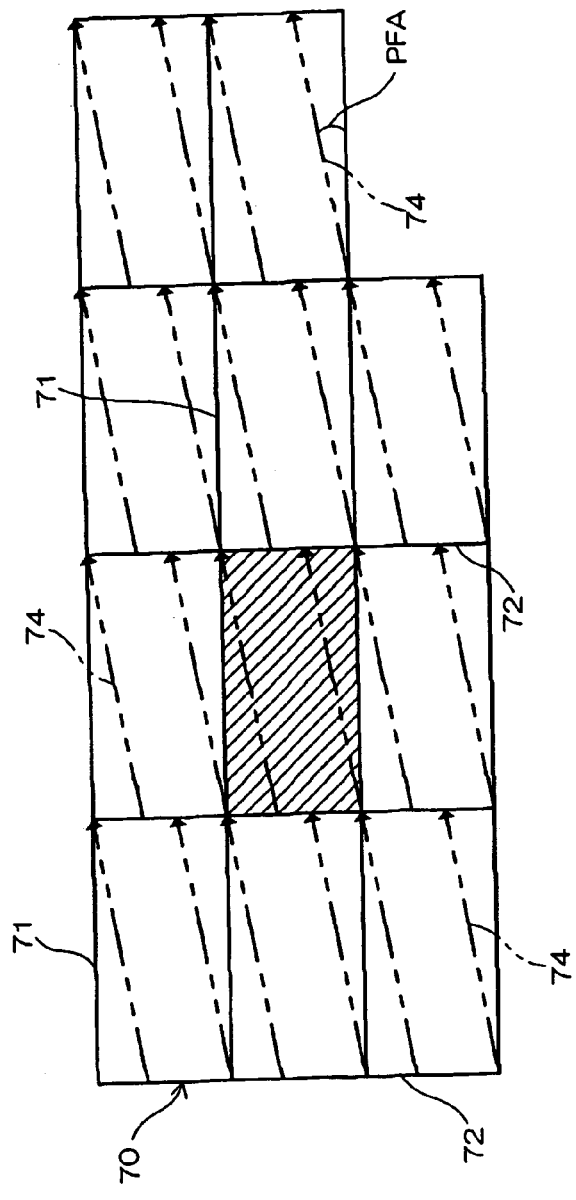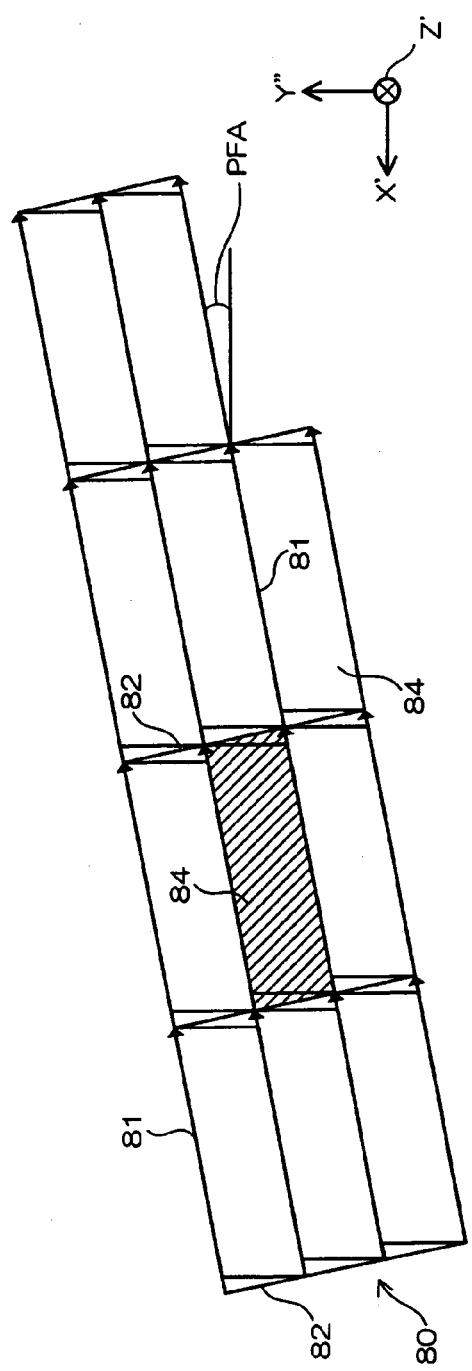
FIG. 5(1)   FIG. 5(2)

SURFACE ACOUSTIC WAVE ELEMENT, METHOD OF MANUFACTURING THE SAME AND SURFACE ACOUSTIC WAVE DEVICE

RELATED APPLICATIONS

This application claims priority to Japanese Patent Application Nos. 2003-414210 filed Dec. 12, 2003, 2004-242806 filed Aug. 23, 2004, and 2003-423153 filed Dec. 19, 2003 which are hereby expressly incorporated by reference herein in their entirety.

BACKGROUND

1. Technical Field

The present invention relates to a surface acoustic wave element utilizing a surface acoustic wave and especially, a surface acoustic wave element in which a phase velocity and a group velocity of the surface acoustic wave are different in directions, and a method of manufacturing the same.

2. Related Art

A surface acoustic wave device (SAW device) utilizing a surface acoustic wave (SAW) uses a surface acoustic wave element in which an interdigital transducer (IDT) is formed on a surface of a piezoelectric plate such like quartz. Conventionally, the SAW devices have been widely used for high frequency filters because their characteristics in high frequency region are excellent. The surface acoustic wave element included in the high frequency filters is mostly formed by a ST cut quartz plate.

Quartz is a single crystal of trigonal system, which is expressed by three crystal axes perpendicular each other, namely an electrical axis (X axis), a mechanical axis (Y axis) and an optical axis (Z axis). These axes are generally expressed as shown in FIG. 10. A cutting angle of a ST cut quartz plate 10 is expressed as ($\phi°=0°$, $\theta°=$approximately 123°, and $\Psi°=0°$ by defining and using Euler angle ($\phi°$, $\theta°$, $\Psi°$). That is, as shown in FIG. 10, the ST cut quartz plate 10 is formed as the quartz plate whose Y' and Z' axes are obtained by rotating the Y and Z axes in counter clock wise about the X axis by $\theta°=$approximately 123° and surface is in parallel with the plane formed by the X and Y' axes. Also, the axis in the direction of the thickness of the ST cut quartz plate 10 perpendicular to a XY' surface is defined as a Z' axis.

A surface acoustic wave element 12 made from the ST cut quartz plate 10 is widely used for SAW resonators and SAW filters due to its excellent frequency stability because a first order coefficient of frequency temperature characteristics is zero. In the surface acoustic wave element 12 made from the ST cut quartz plate 10, as shown in FIG. 10, an IDT 14 and reflectors 16 are formed along the X axis.

Meanwhile, in a case where the ST cut quartz plate 10 is used for a SAW resonator included in high frequency oscillators, it is difficult to achieve characteristics to satisfy specifications required. That is, if the surface acoustic wave element 12 is used for SAW filters, a high Q value of such like resonators oscillating a specific frequency is not needed because the operation is required in relatively wide frequency range. However, the surface acoustic wave element 12 made from the ST cut quartz plate 10 has a second-order temperature coefficient that is a relatively large value, even though the first-order temperature coefficient is zero. Therefore, it is known that a resonance frequency of the surface acoustic wave element 12 made from the ST cut quartz plate 10 fluctuates approximately 100 ppm in the temperature range from minus 20 degrees centigrade to plus 80 degrees centigrade that is operation temperature range of the SAW resonators. Thus, frequency characteristics required in high accuracy communication equipment or the like cannot be satisfied.

Consequently, the inventors of the present invention developed a surface acoustic wave resonator using a surface acoustic wave element 20 (Japanese Patent No. 3216137). As shown in FIG. 10, the surface acoustic wave element 20 is obtained by rotating the X and Y' axes about the Z' axis by $\phi°$ to be a X' axis and a Y" axis respectively such that its cutting angle is expressed as (0°, $\theta°$, $\Psi°$) with the Euler angle. In the surface acoustic wave element 20 formed by rotating the ST cut quartz plate 10 in the plane, an IDT 14 and reflectors 16 are formed along the X' axis. This makes it possible to make its second-order temperature coefficient smaller than that of the surface acoustic wave element 12 formed without rotating the ST cut quartz plate 10 in the plane, thereby resulting to extremely excellent frequency characteristics.

However, in the surface acoustic wave element 20 formed by rotating the ST cut quartz plate 10 in the plane, the direction of the phase velocity that a phase of the surface acoustic wave is propagated and the direction of the group velocity that a wave group (wave packet) is propagated are different because quartz single crystals have anisotropy ("Surface Acoustic Wave Element Technical Handbook", Edited by Japan Society for the Promotion of Science Surface Acoustic Wave Technical Committee 150, First Edition First Printed, Issued 1991, Nov. 30, p 154). The direction of the group velocity is the direction that energy of the surface acoustic wave is propagated. The angle formed between the direction of the phase velocity and the direction of the group velocity is called a power flow angle PFA. In addition, the surface acoustic wave element cannot obtain a large Q value required for resonators unless the wave group propagated in the direction of the group velocity is reflected. Accordingly, in a case where the IDT and the reflectors are formed along the X' axis, the surface acoustic wave generated in the IDT is not efficiently reflected by the reflectors. As a result, this lessens the Q value. Therefore, the inventors of the invention developed, in Japanese Patent No. 3216137, a surface acoustic wave element 30 shown in FIG. 11. In the surface acoustic wave element 30, a IDT 34 and reflectors 36 provided both side of the IDT 34 that are formed on a surface of a quartz plate 32 are arranged along the direction of the group velocity so as to reflect the surface acoustic wave by the reflectors 36 to obtain a large Q value.

Meanwhile, according to "Surface Acoustic Wave Element Technical Handbook", Edited by Japan Society for the Promotion of Science Surface Acoustic Wave Technical Committee 150, First Edition First Printed, Issued 1991, Nov. 30, p 154, a power flow angle PFA of an in-plane rotated quartz plate, namely, the PFA that is the angle formed between the direction of the phase velocity and the direction of the group velocity of the surface acoustic wave, can be obtained by the equation 1.

$$PFA=\tan^{-1}\{(1/v)\cdot(\partial v/\partial\Psi)\} \quad \text{Equation 1}$$

where v is the phase velocity of the surface acoustic wave and $\Psi$ is the in-plane rotated angle of the quartz plate.

However, conventionally, an accurate phase velocity of the surface acoustic wave generated in the in-plane rotated ST cut quartz plate has not been obtained. Thus, it is uncertain that whether or not the IDT and reflectors arranged in the direction of the group velocity based on the power flow angle PFA obtained by the equation 1 is really arranged in the direction of the group velocity.

Also, the surface acoustic wave element is generally formed a rectangular like.

Similarly, in the surface acoustic wave element 30 described in Japanese Patent No. 3216137, the quartz plate 32 on which the IDT 34 and a pair of reflectors 36 are formed is cut as a rectangular like from the quartz wafer. Then, the quartz plate 32 is cut such that two edges faced each other being long edges 38 and 39 are along the X' axis that is the direction of the phase velocity of the surface acoustic wave. Because of this, in the surface acoustic wave element 30, wasted regions are formed both sides of the IDT 34 and the reflectors 36. Thus, the area of the quartz plate 32 becomes unnecessarily larger than the region in which the IDT 34 and the reflectors 36 are formed and the surface acoustic wave is effectively propagated. Therefore, the surface acoustic element 30 becomes so large that the number of elements formed in one wafer and a yield rate lessen. As a result, costs are increased.

In order to solve the disadvantages of the above-mentioned related art, the present invention aims to enable the IDT and reflectors to be reliably arranged along the direction of the group velocity of the in-plane rotated quartz plate.

Also, the invention aims to enable the Q value of the surface acoustic wave element using the in-plane rotated quartz plate to be large.

Further, the invention aims to enable the surface acoustic element to be smaller.

Moreover, the invention aims to enable the yield rate to be increased.

SUMMARY

The inventors et al., have devoted themselves to conducting research on the in-plane rotated ST cut quartz plate. The phase velocity of a surface acoustic wave has precisely been analyzed using a finite element method (FEM) and the power flow angle PFA of the in-plane rotated ST cut quartz plate has been examined using the phase velocity. As a result, it has been found out that the power flow angle PFA of the in-plane rotated ST cut quartz plate depends on a rotation angle $\theta$ about the X axis being the electrical axis. The present invention is based on such information.

That is, the surface acoustic wave element of a first aspect of the invention includes an in-plane rotated ST cut quartz plate whose cutting angle is expressed as (0°, 113°-135°, ±(40°-49°)) by defining and using Euler angle of ($\phi$°, $\theta$°, $\Psi$°), an interdigital transducer and a reflector. The interdigital transducer and the reflector that are formed on a surface of the quartz plate are arranged at a slant of a PFA±3° with respect to a direction of a phase velocity of a surface acoustic wave in the quartz plate. The PFA is represented by the equation 2.

$$PFA = 0.374(\theta° - 90°) - 10.0°\qquad\text{Equation 2}$$

According to the research conducted by the inventors of the invention et al., it has been found that the power flow angle PFA of the in-plane rotated ST cut quartz plate whose cutting angle is (0°, 113°-135°, ±(40°-49°)) can be obtained by the above-described equation 2 if the rotation angle about the X axis is $\theta$°. Thus, in a case where a surface acoustic wave element using the in-plane rotated ST cut quartz plate is formed, an interdigital transducer (IDT) and a reflector are arranged along a direction making an angle of the power flow angle PFA obtained by the equation 2 with respect to a direction of a phase velocity of a surface acoustic wave. This makes it possible to reliably arrange the IDT and reflector along a direction of a group velocity of the surface acoustic wave so as to enable a wave group of the surface acoustic wave generated in the IDT to efficiently be reflected by the reflector. As a result, a Q value can be increased.

In addition, according to the experiments conducted by the inventors et al., even if the arranged direction of the IDT and reflector is shifted by ± approximately 3° from the power flow angle PFA obtained by the equation 2, an adequately large Q value can be obtained. Especially, even if the arranged direction of the IDT and reflector is shifted by ± approximately 1° from the power flow angle PFA, few influences are given to the Q value. Consequently, the angle between the arranged direction of the IDT and reflector, and the direction of the phase velocity of the surface acoustic wave can be set the PFA±3°.

The crystal plate may be sliced such that two edges faced each other are along the arranged direction of the IDT and reflector. Normally, the quartz plate for the surface acoustic wave element is sliced such that two edges faced each other are along a propagation direction of the phase of the surface acoustic wave (the direction of the phase velocity). However, in a case where the IDT and reflector are arranged in the direction different from the direction of the phase velocity, if two edges faced each other of the quartz plate are sliced so as to be along the direction of the phase velocity, a large wasted region is formed at the side of the IDT and reflector because the arranged direction of the IDT and reflector is intersected with the edges of the quartz plate. Thus, the two edges faced each other of the quartz plate are sliced so as to be along the arranged direction of the IDT and reflector. This allows forming no wasted region at the side of the IDT and reflector and makes it possible to downsize the surface acoustic wave element, thereby increasing the number of elements formed in the quartz wafer to increase a yield rate.

In addition, the surface acoustic wave element of a second aspect of the invention includes a quartz plate of which an interdigital transducer is formed on a surface and in which a direction of a phase velocity of a surface acoustic wave and a direction of a group velocity of the surface acoustic wave are different. The two edges faced each other of the quartz plate are along the direction of the group velocity.

In the above-mentioned second aspect of the invention, since the direction of the phase velocity and the direction of the group velocity of the surface acoustic wave are different, if the IDT and reflector are formed along the direction of the group velocity in order to increase the Q value of the surface acoustic wave element, the two edges coincide the formed direction of the IDT and reflector. This allows forming no wasted region at the side of the IDT and reflector and makes it possible to reduce the area of the surface acoustic wave element to achieve a downsizing, thereby increasing the number of elements formed in the quartz wafer to increase a yield rate.

The four edges of the quartz plate can be formed along a pattern defined by the interdigital transducer and reflector. In a case where the surface acoustic wave is generated in the interdigital transducer, if the interdigital transducer and reflector are arranged along the direction of the group velocity of the surface acoustic wave, electrode fingers of the interdigital transducer and conductive strips are crossed at an angle with respect to the arranged direction of the interdigital transducer and reflector. Therefore, if the four edges of the quartz plate are formed along the pattern defined by the interdigital transducer and reflector, the edge of the quartz plate facing the outside edge of the reflector becomes in parallel with the reflector. This makes it possible to further downsize the surface acoustic element.

The quartz plate can be formed so as to include two edges perpendicular to the direction of the group velocity of the surface acoustic wave. In the quartz plate formed as above-mentioned, the wave group escaped from the reflector can efficiently be reflected at the end face of the quartz plate. The one side of the reflector opposite from another side facing the interdigital transducer can be extended to the edge of the quartz plate. In the surface acoustic wave element, the effect of the end face of the quartz plate is lessened with increasing frequencies to higher side. Thus, even if the edge of the reflector is extended to the edge of the quartz plate, a few influences are given to the Q value. In addition, since the edge of the reflector can coincide the edge of the quartz plate (edge of the surface acoustic wave element), the downsizing can further be achieved.

A method of manufacturing a surface acoustic wave element of a third aspect of the invention includes a wafer forming process forming a quartz wafer having a predetermined cutting angle, a film forming process depositing a metal thin film on a surface of the quartz plate, a resist film forming process forming a resist film on the metal thin film, an alignment for exposure process in which a photo mask is set above the quartz wafer and the photo mask, and the quartz wafer are aligned such that a setting direction of a pattern provided on the photo mask for forming the interdigital transducer and the reflector is aligned to a predetermined direction of a group velocity making an angle of a power flow angle with respect to a direction of a phase velocity of a surface acoustic wave in the quartz wafer, a photo process exposing and developing the photo resist film, a patterning process etching the metal thin film using the resist film as a mask so as to form the interdigital transducer and the reflector, and a dicing process slicing the quartz wafer so as to be split to an element whose two edges faced each other are along the direction of the group velocity of the surface acoustic wave.

In the third aspect of the invention, for example, an orientation flat of the quartz wafer (quartz plate) is aligned to a reference line of the photo mask. In the photo mask, a pattern for forming the IDT and reflector is arranged at a slant of an angle with respect to the reference line to be aligned to the orientation flat of the quartz wafer, the angle being taken an in-plane rotated angle (p and the direction of the group velocity of the surface acoustic wave into consideration. Accordingly, if the orientation flat of the quartz wafer and the reference line of the photo mask are aligned, the pattern for forming the IDT and reflector formed on the photo mask is arranged in the direction of the group velocity different from the direction of the phase velocity of the surface acoustic wave in the quartz wafer. Consequently, the alignment of the photo mask to the quartz wafer for exposing the resist film can easily be conducted. In addition, since the quartz wafer is formed in which the two edges faced each other of the element are along the direction of the group velocity, the surface acoustic wave element can be smaller than ever before, a yield rate per quartz wafer can be increased. Also, the direction of the group velocity of the quartz wafer, namely, the power flow angle that is the angle between the direction of phase velocity and the direction of the group velocity can be defined by the above-described equation 2.

In addition, the surface acoustic wave device of a fourth aspect of the invention includes any of the surface acoustic wave elements described above. This can achieve the above-mentioned effects.

BRIEF DESCRIPTION OF THE DRAWINGS

FIG. 5 is a diagram to compare a photo mask for the surface acoustic wave element of the embodiment and conventional example.

DETAILED DESCRIPTION

Embodiments of a surface acoustic wave element, method of manufacturing the same and a surface acoustic wave device according to the present invention will be explained with reference to the drawings. The parts that have been explained in the background are labeled with the same numbers and the explanations for them will be omitted.

Figure 1:
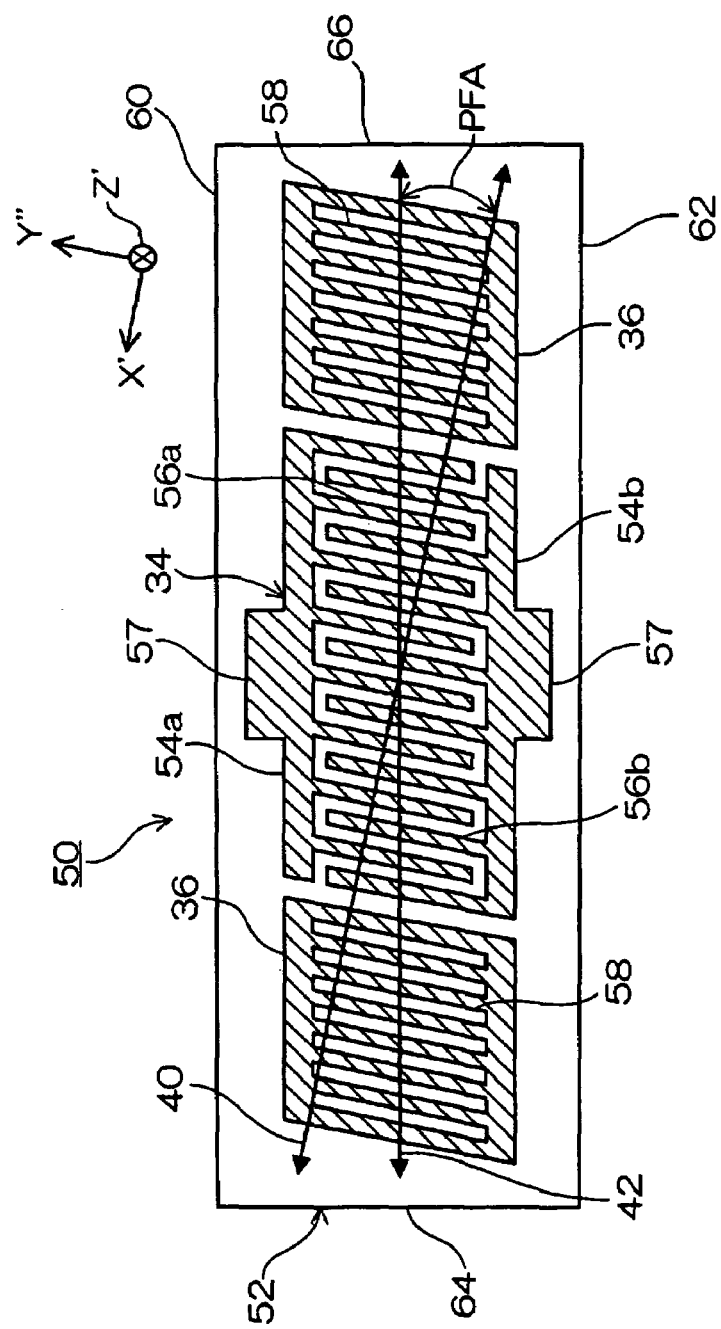
FIG. 1 is a plan view of the surface acoustic wave element of a first embodiment of the present invention.

FIG. 1 is a plain view of the surface acoustic wave element according to a first embodiment of the present invention. In FIG. 1, a surface acoustic wave element 50 is made from a quartz element 52 that is a piezoelectric substance and formed as a rectangular like. An IDT 34 is formed on a center part of a surface of the quartz element 52. The IDT 34 is configured with a paired interdigital transducer 54 (54a and 54b) in which an electrode fingers 56 (56a and 56b) equivalent to the comb teeth of the paired interdigital transducer 54 are arranged alternately and parallel with an equal distance. In the IDT 34, a surface acoustic wave having a predetermined frequency is generated in a surface layer part of a quartz plate 52 by a signal voltage applied between an interdigital transducer 54a and an interdigital transducer 54b. Also, each of the paired interdigital transducer 54 includes wire-bonding pad 57 at an outside center part thereof opposite from the electrode fingers 56.

Further, the surface acoustic wave element 50 includes the reflectors 36 at both sides of the IDT 34. Each reflector 36 is configured the same way. A plurality of conductive strips 58 is included in each. In each reflector 36, both ends of each of the plurality of conductive strips 58 are interconnected to form a grid like. In this embodiment, the IDT 34 and the pair of reflectors 36 are formed with thin film of aluminum or an aluminum alloy (hereinafter referred to as simply aluminum). That is, the IDT 34 and the reflectors 36 are formed in a predetermined shape by etching the aluminum thin film deposited on a surface of the quartz wafer by a vapor deposition or a sputtering or the like.

Figure 10:
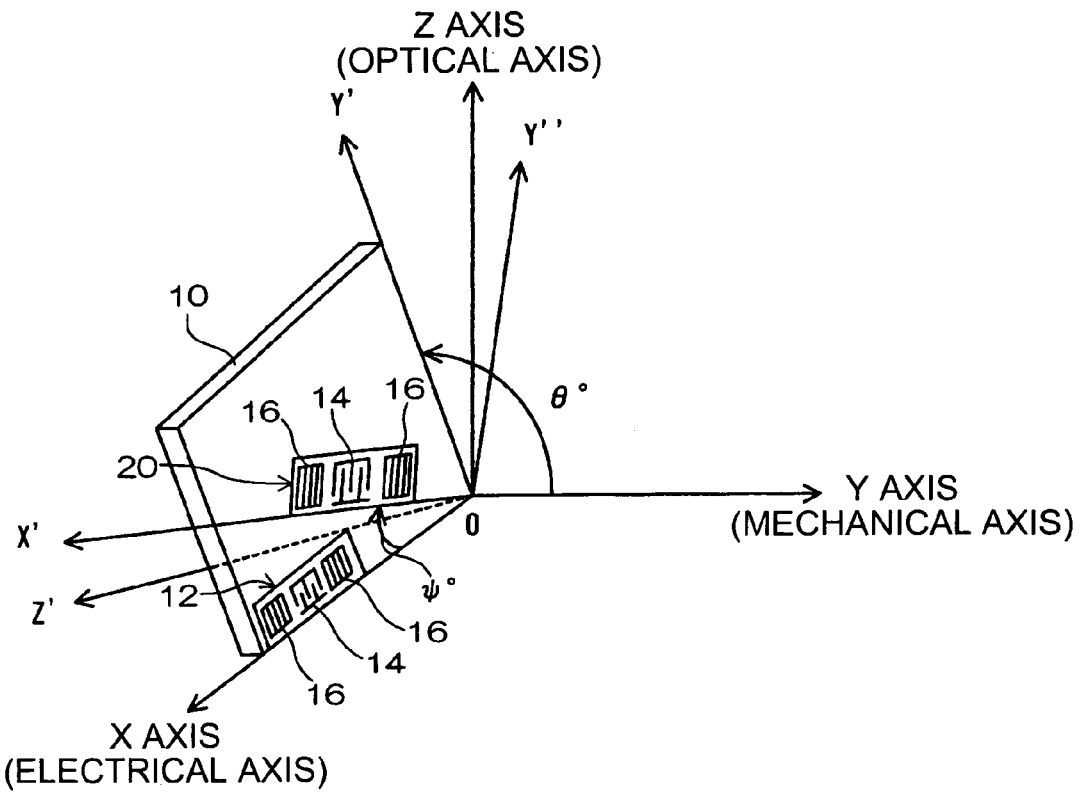
FIG. 10 is a diagram to explain a cutting angle of quartz.

In the embodiment, the quartz plate 52 is made from so-called ST cut quartz plate that is rotated in a plane (in-plane rotated ST cut), whose cutting angle is that of the ST cut quartz plate rotated about Z' axis shown in FIG. 10 by a predetermined +Ψ° or −Ψ°. That is, the cutting angle of the quartz plate 52 of the embodiment is expressed as (0°, 113°-135°, ±(40°-49°)) by defining and using Euler angle (φ°, θ°, Ψ°). In a case where the quartz plate 52 whose cutting angle is in the above-mentioned range, a surface acoustic wave element 50 that is excellent in frequency temperature characteristics can be achieved.

Figure 2:
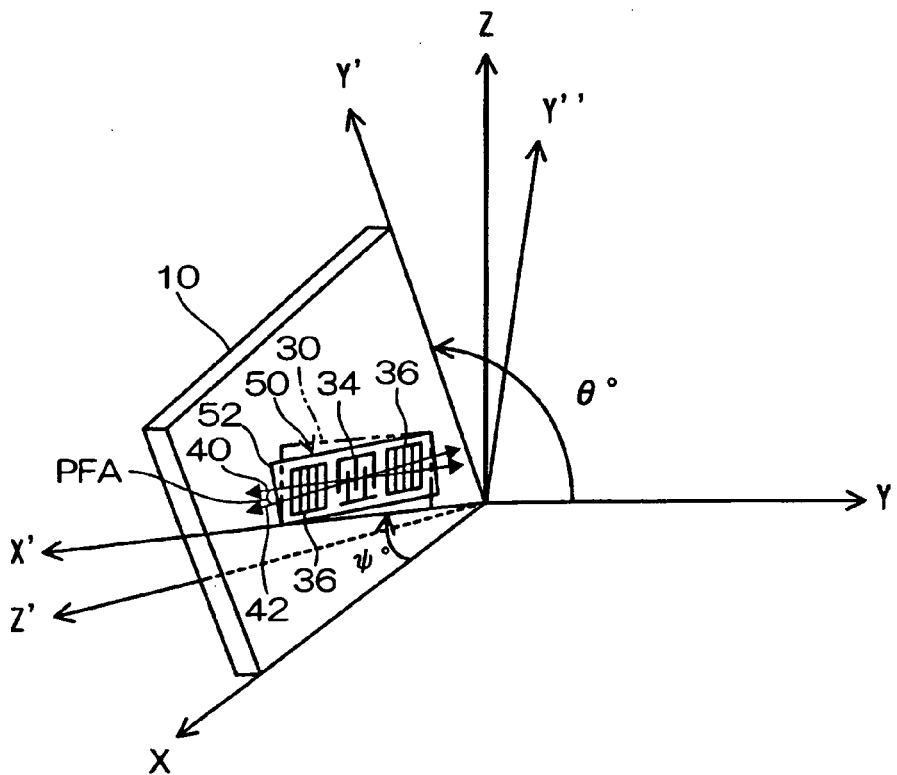
FIG. 2 is a diagram to explain the difference of the surface acoustic wave element in the embodiment and conventional example.

Meanwhile, in such in-plane rotated ST cut quartz plate, the direction of the phase velocity along which the phase of the surface acoustic wave is propagated and the direction of the group velocity along which the wave group of the surface acoustic wave is propagated are different due to the anisotropy of crystal in a case where the surface acoustic wave is generated in the IDT 34. Accordingly, in the quartz plate 52 made from the in-plane rotated ST cut quartz plate, as shown in FIG. 2, a direction 40 of the phase velocity of the surface acoustic wave is along the X' axis, and a direction 42 of the group velocity intersects with the direction 40 of the phase velocity. The direction 42 of the group velocity is the direction that energy of the surface acoustic wave is propagated. The angle formed between the direction 40 of the phase velocity and the direction 42 of the group velocity is called a power flow angle PFA. The power flow angle PFA of the in-plane rotated quartz can be obtained by the above-mentioned equation 1.

Figure 3:
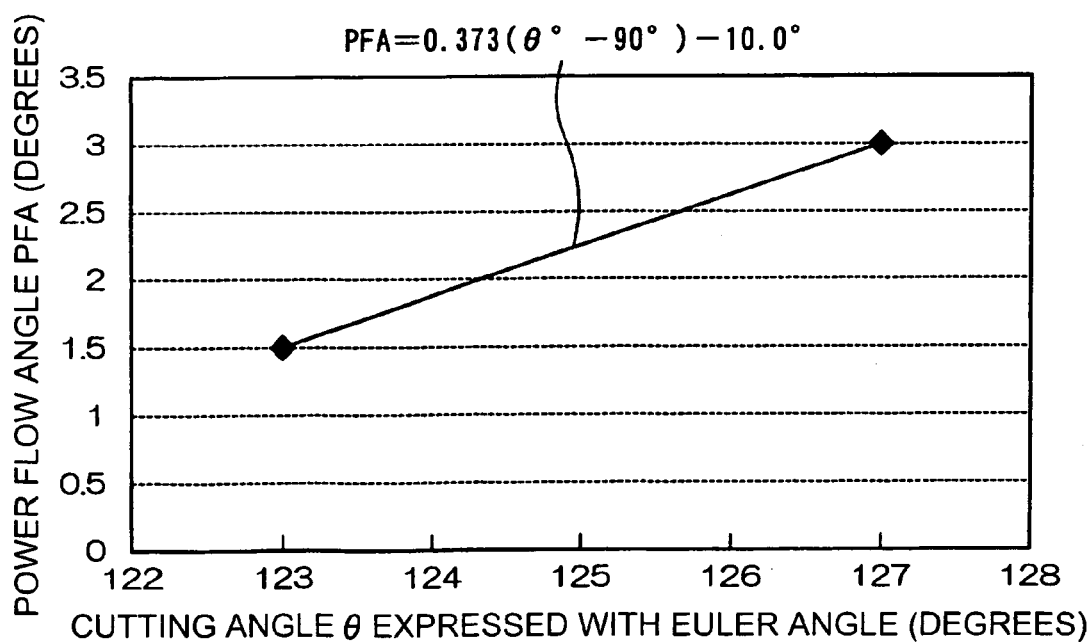
FIG. 3 is a diagram showing the relation between a cutting angle of an in-plane rotated ST cut quartz plate and a power flow angle.

However, in the in-plane rotated ST cut quartz plate, conventionally, the accurate phase velocity of the surface acoustic wave has been uncertain. Therefore, the inventors of the invention et al., have obtained the phase velocity of the surface acoustic wave by precisely analyzing the in-plane rotated ST cut quartz plate using a finite element method. Further, the inventors of the invention et al., have examined the power flow angle PFA of the in-plane rotated quartz plate based on the phase velocity obtained and found out that it depends on a rotation angle θ shown in FIG. 2. According to the analysis conducted by the inventors of the invention et al., the power flow angle PFA of the in-plane rotated quartz plate whose cutting angle is expressed as (0°, 113°-135°, ±(40°-49°)) by defining and using the Euler angle is the linear function of the θ. As shown in FIG. 3, it turned out to be represented by the equation 3.

$$PFA = 0.3737\,(\theta° - 90°) - 10.0°$$
$$\approx 0.374\,(\theta° - 90°) - 10.0°$$
Equation 3

Therefore, in the surface acoustic wave element 50 of the embodiment, the IDT 34 and the reflectors 36 are arranged along the direction 42 of the group velocity such that the wave group (wave packet) propagated to the direction 42 of the group velocity is efficiently reflected to obtain a high Q value. However, the electrode fingers 56 of the IDT 34 and the conductive strips 58 of the reflectors 36 are formed such that their longitudinal directions are perpendicular to the X' axis that is the direction 40 of the phase velocity, namely, along the Y" axis. Also, in the quartz plate 52 of the embodiment, one pair of edges (long edges) 60 and 62 that are faced each other are along the arranged direction of the IDT 34 and the reflectors 36, and another pair of edges (short edges) 64 and 66 are perpendicular to the edges 60 and 62. Thus, the short edges 64 and 66 are perpendicular to the direction 42 of the group velocity of the surface acoustic wave. This is due to the following reasons.

Figure 11:
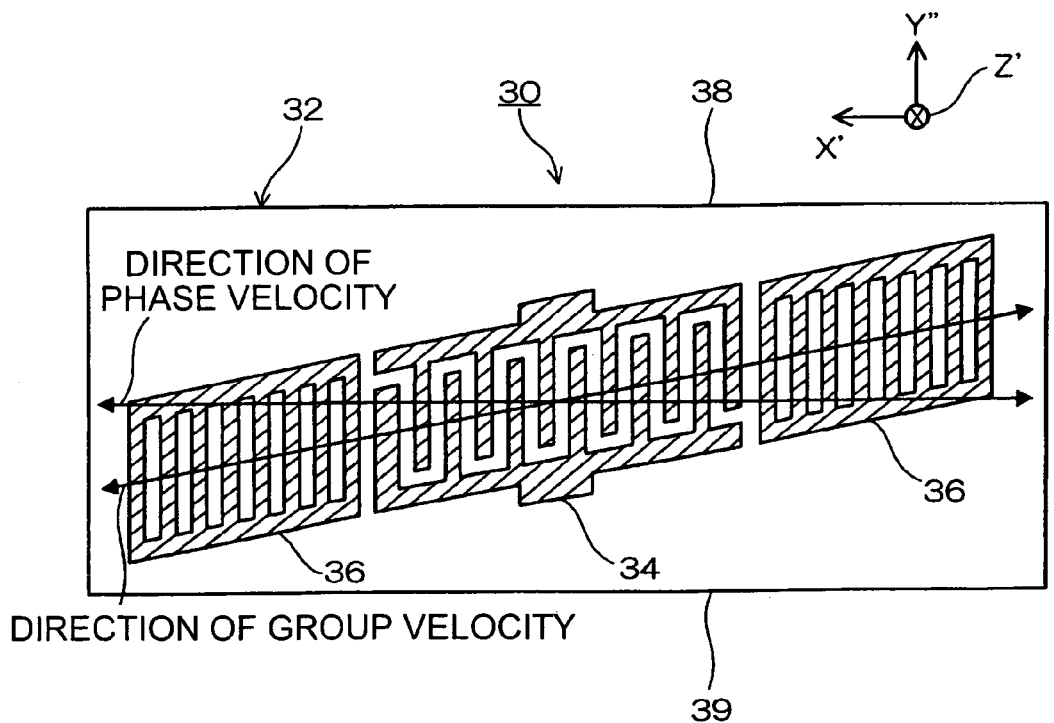
FIG. 11 is a plan view schematically shown a conventional surface acoustic wave element.

In order to form the surface acoustic element made from the in-plane rotated ST cut quartz plate, it is assumed that the IDT 34 and the reflectors 36 are arranged along the direction 42 of the group velocity of the surface acoustic wave as mentioned above. In this case, likewise the surface acoustic wave element 30 being conventional shown with two-dot chain line in FIG. 2, a large wasted region is formed at the side part of the IDT 34 and the reflectors 36 if the two edges (long edges) of the quartz plate that are faced each other are cut in parallel with the X' axis (the direction 40 of the phase velocity). (Refer to FIG. 11) Therefore, the larger element is, the lower yield rate per quartz wafer is. As a result, manufacturing costs are increased.

In contrast, likewise the surface acoustic wave element 50 shown in FIG. 1, few wasted region is formed at the side part of the IDT 34 and the reflectors 36 if the two edges of the quartz plate 52 that are faced each other are cut along the direction 42 of the group velocity of the surface acoustic wave, namely, along the arranged direction of the IDT 34 and the reflectors 36. Accordingly, the surface acoustic wave element 50 of the embodiment can be smaller than ever before, and increase the yield rate per quartz wafer. In addition, in the surface acoustic wave element 50, since another two edges (short edges) 64 and 66 are perpendicular to the direction 42 of the group velocity of the surface acoustic wave, the wave group escaped from the reflectors 36 can efficiently be reflected to increase the excitation efficiency of the surface acoustic wave.

Meanwhile, the IDT 34 and the reflectors 36 are not always thoroughly arranged in the direction of the group velocity due to a manufacturing error or the like. According to the experiments conducted by the inventors of the invention et al., with various kinds of examinations, it is realized that even if the IDT 34 and the reflectors 36 are arranged out of the power flow angle PFA obtained by the equation 3 by ± approximately 3°, an adequately large Q value can be obtained. Especially, if the error is ± approximately 1° to the power flow angle PFA, few influences are given to the Q value. Consequently, in the embodiment, an arranged direction 44 of the IDT 34 and the reflectors 36 is set such that an angle made with respect to the direction 40 of the phase velocity of the surface acoustic wave is the PFA±3°.

Figure 4:
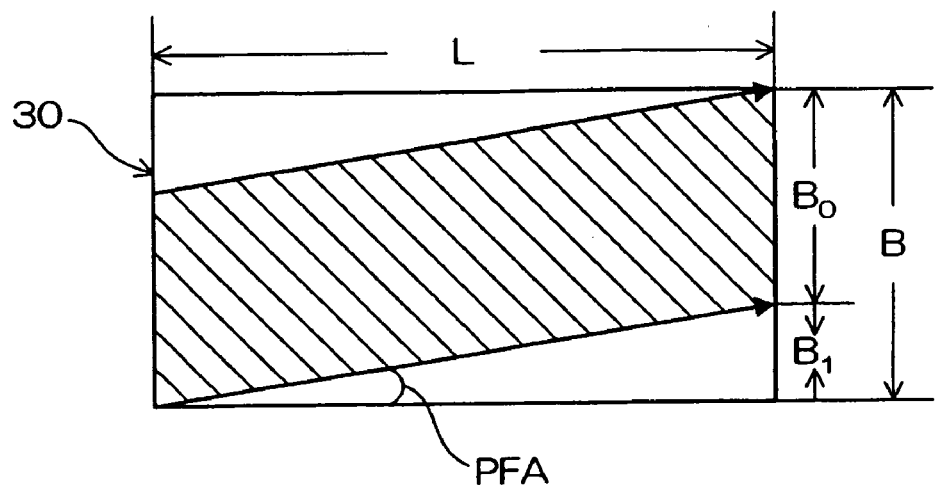
FIG. 4 is a diagram to compare the size of the surface acoustic wave element of the embodiment and conventional example.
Figure 4:
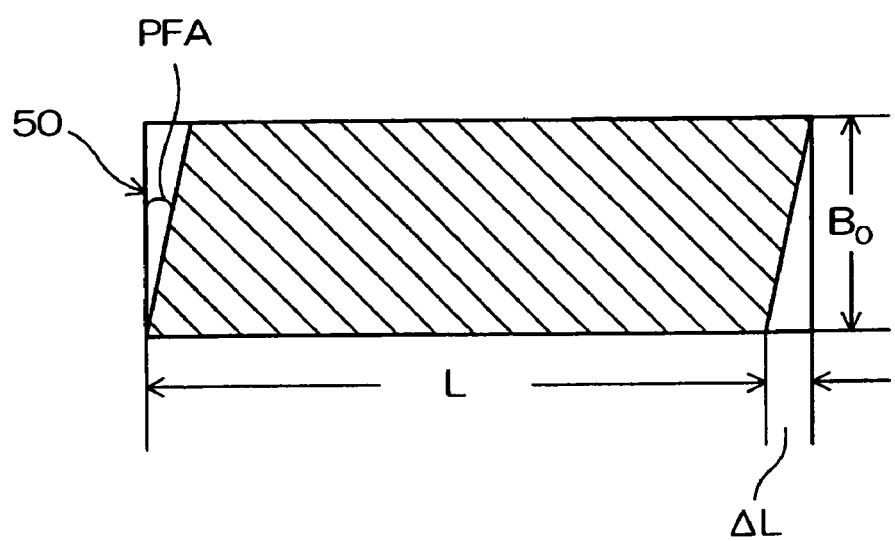

FIG. 4 shows diagrams comparing the size of the surface acoustic wave element 30 being conventional to that of the surface acoustic wave element 50 of the first embodiment. FIG. 4(1) shows the surface acoustic wave element 30 being conventional. FIG. 4(2) shows the surface acoustic wave element 50 of the first embodiment. A hatched area is represented the region necessary to form the element in which the IDT and the reflectors are formed. The area of the surface acoustic wave element 30 being conventional is represented by the equation 4.

$$A = L \times B = L \times (B_0 + B_1)$$
Equation 4 where A is the area of the surface acoustic wave element 30, L is the length of the surface acoustic wave element 30, and B is the width of the surface acoustic wave element 30, $B_0$ is the minimum width necessary to form the element, and $B_1$ is the maximum distance from the minimum region necessary to form the element to the long edge of the quartz plate.

$B_1$ is represented by the equation 6 from the relation represented by the equation 5.

$$\tan(PFA) = B_1/L$$
Equation 5

$$B_1 = L\,\tan(PFA)$$
Equation 6 where PFA is the power flow angle. Therefore, the area A of the surface acoustic wave element 30 is represented by the equation 7 if the equation 6 is substituted for the equation 4.

$$A = L \times (B_0 + L \tan(PFA)) = (B_0 \times L) + L^2 \tan(PFA) \quad \text{Equation 7}$$

Accordingly, in the surface acoustic wave element 30, the ratio r of the area A to the minimum area necessary to form the element represented by the hatched lines is represented by the equation 8.

$$r = [\{(B_0 \times L) + L^2 \tan(PFA)\}/(L \times B_0)] \times 100\% \quad \text{Equation 8}$$

Here, if the dimensions of the element (chip) having necessary region represented by the hatched lines: L=2 mm, $B_0$=0.5 mm, the equation 8 becomes the equation 9.

$$r = [\{(0.5 \times 2) + 4 \tan(PFA)\}/(2 \times 0.5)] \times 100\% \quad \text{Equation 9}$$
$$= (1 + 4 \tan(PFA)) \times 100\%$$

In contrast, in the surface acoustic wave element 50 of the embodiment shown in FIG. 4(2), the width is $B_0$. However, the length is increased by $\Delta L = B_0 \tan(PFA)$. Thus, the area S of the surface acoustic wave element 50 of the embodiment is represented by the equation 10.

$$S = B_0 \times (L + B_0 \tan(PFA)) \quad \text{Equation 10}$$
$$= (B_0 \times L) + B_0^2 \tan(PFA)$$

The ratio R of the area S to the hatched area is represented by the equation 11 if L=2 mm and $B_0$=0.5 mm are substituted for it.

$$R = [\{(B_0 \times L) + B_0^2 \tan(PFA)\}/(B_0 \times L)] \times 100\% \quad \text{Equation 11}$$
$$= (1 + 0.25 \tan(PFA)) \times 100\%$$

Consequently, the surface acoustic wave element 50 of the embodiment can drastically be downsized as compared with the surface acoustic wave element 30 being conventional.

FIG. 5 schematically shows a photo mask for forming the surface acoustic wave element 30 being conventional and a photo mask for forming the surface acoustic wave element 50 of the first embodiment. FIG. 5(1) is a photo mask 70 for forming the surface acoustic wave element 30 being conventional. FIG. 5(2) is a photo mask 80 for forming the surface acoustic wave element 50 of the embodiment. Both show a part of them.

The hatched area of the photo mask 70 is the region surrounded with scribe lines 71 and 72 for forming the surface acoustic wave element 30. Also, a region 74 represented by the two-dot chain lines in the photo mask 70 shows the region necessary to form the IDT and the reflectors, in which a pattern (not shown) for forming the IDT and the reflectors is formed. The region 74 is slanted with respect to the scribe line 71 shown in horizontal direction in the figure by the power flow angle PFA in order to form the IDT and the reflectors along the direction of the group velocity.

Figure 7:
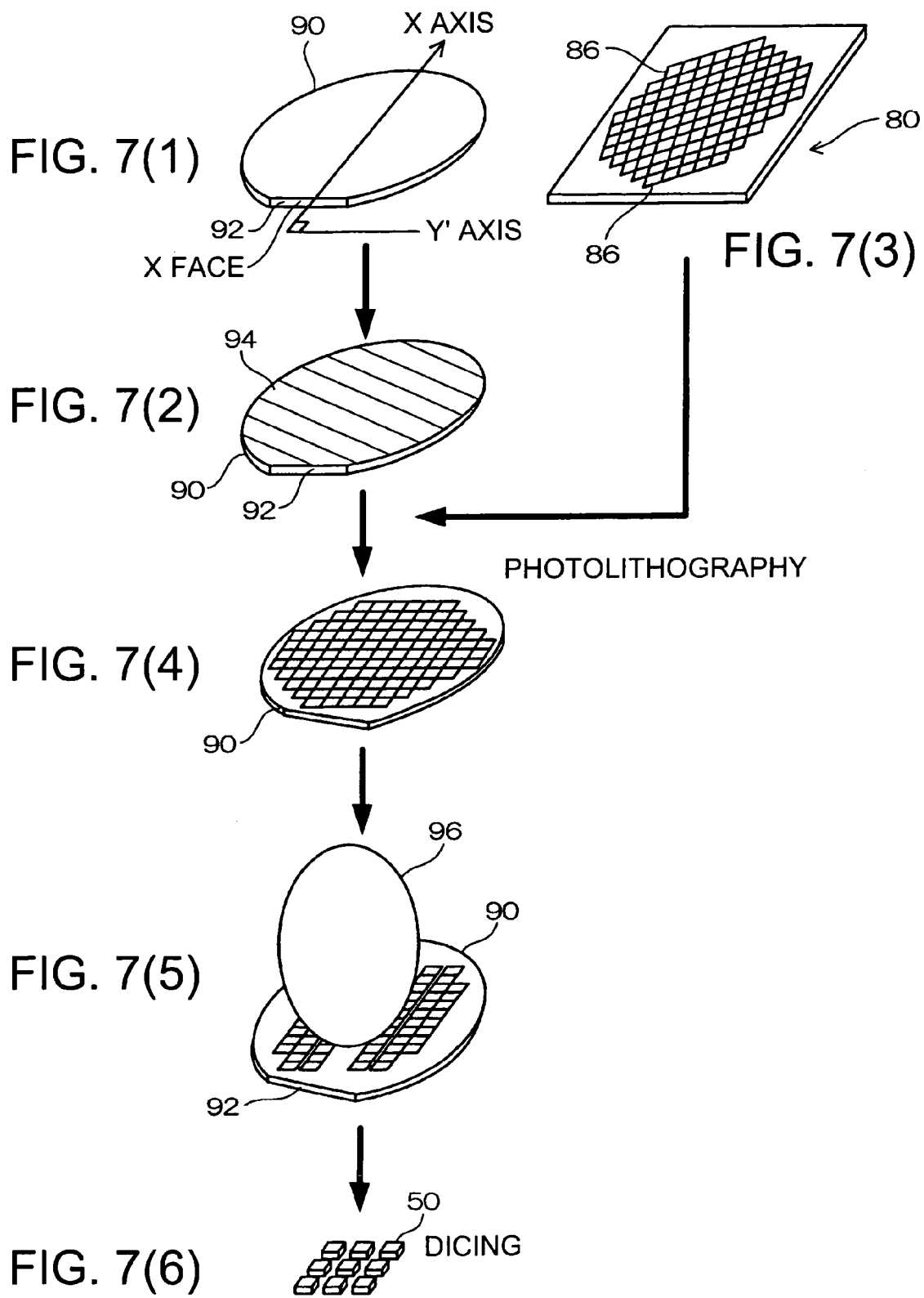
FIG. 7 is a diagram to explain a method of manufacturing the surface acoustic wave element of the embodiment.

Also, in a case when a reference line (not shown) of the photo mask 70 is aligned to an orientation flat 92 of a quartz wafer 90 shown in FIG. 7, the scribe line 71 in horizontal direction is set with respect to the orientation flat 92 at a slant of the angle equal to the in-plane rotated angle $\Psi$. That is, in the quartz wafer 90, which is a ST cut quartz substrate, the orientation flat 92 is formed perpendicular to the X axis of the quartz. In a case when the quartz wafer 90 and the photo mask 70 are aligned, the reference line (not shown) formed in the photo mask 70 is aligned to the orientation flat 92 of the quartz wafer 90. Therefore, the scribe line 71 in horizontal direction of the photo mask 70 is slanted with respect to the reference line by an angle equal to the in-plane rotated angle $\Psi$.

In contrast, in the photo mask 80 shown in FIG. 5(2), the hatched area surrounded by scribe lines 81 and 82 that are perpendicular to each other is a region 84 to form the surface acoustic wave element 50. Also, in a case when a reference line (not shown) of the photo mask 80 is aligned to the orientation flat 92 of the quartz wafer 90, the scribe line 81 is set with respect to the orientation flat 92 of the quartz wafer 90 at a slant of the angle equal to the sum of the in-plane rotated angle $\Psi$ and the power flow angle PFA.

Figure 6:
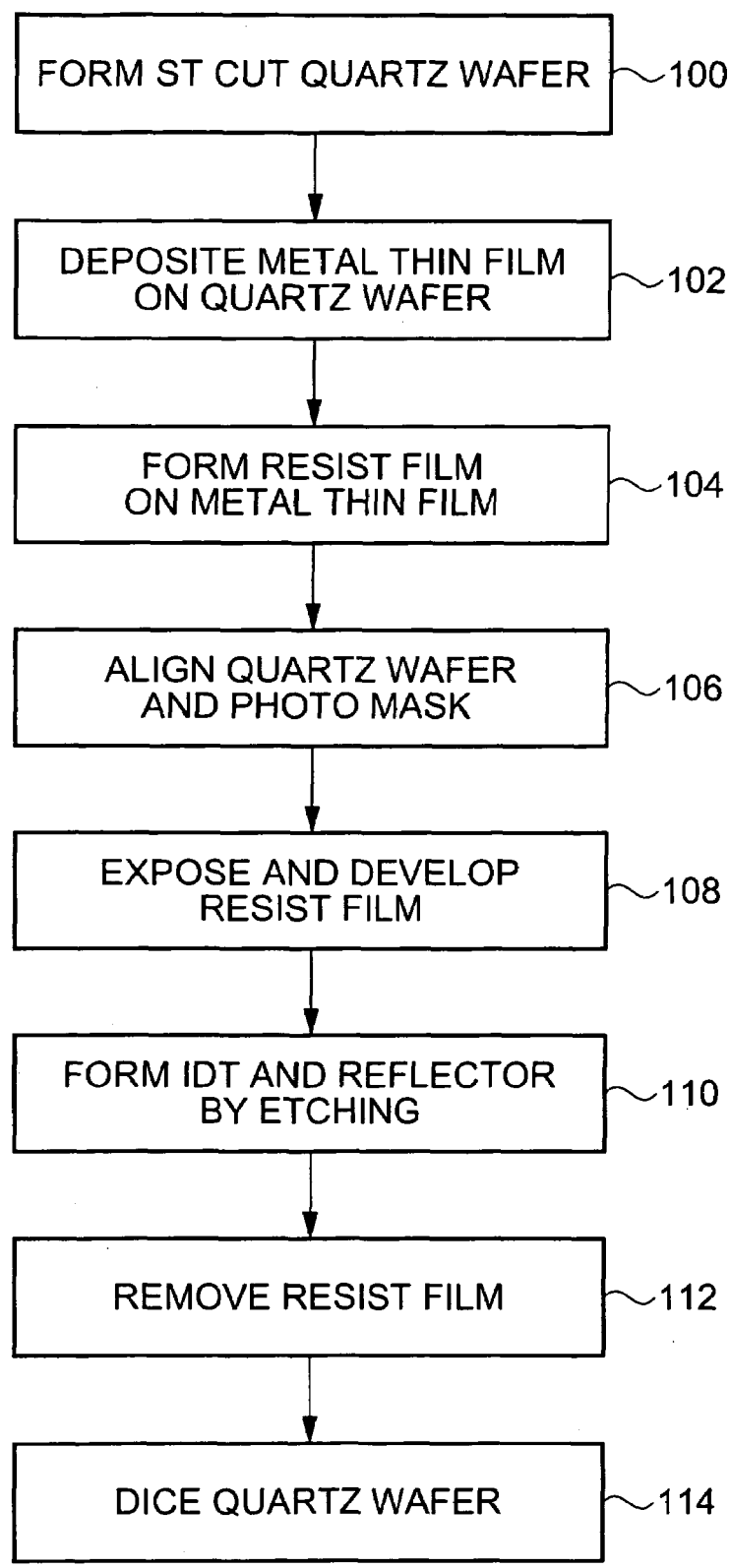
FIG. 6 is a flow chart to explain a method of manufacturing the surface acoustic wave element of the embodiment.

FIG. 6 is a flow chart to explain a method of manufacturing the surface acoustic wave element 50 of the embodiment. In a case when the surface acoustic wave element 50 is formed, firstly, a wafer forming process is conducted to manufacture the quartz wafer 90 (refer to FIG. 7). (Step 100 in FIG. 6) In this embodiment, the quartz wafer 90 is made from the ST cut quartz substrate expressed with the Euler angle (0°, 113°-135°, 0°). As shown in FIG. 7(1), in the quartz wafer 90, the orientation flat 92 is formed perpendicular to the X axis of the quartz, the orientation flat 92 indicating the arranging direction of the quartz wafer 90 and being used for aligning photo masks or the like.

Then, as shown in step 102 in FIG. 6 and in FIG. 7(2), a film forming process is conducted. In the film forming process, a metal thin film 94 for electrodes such like aluminum or the like is deposited on the surface of the quartz wafer 90 by a vapor deposition or a sputtering or the like. Subsequently, a resist film forming process is conducted (step 104). In the process, a photo resist is applied on the metal thin film 94 so as to form a resist film after drying. Next, an alignment for exposure process is conducted (step 106). In the process, the photo mask 80 shown in FIG. 7(3) is set above the quartz wafer 90 so as to align the reference line (not shown) of the photo mask 80 to the orientation flat 92 that is the reference line of the quartz wafer 90. In this embodiment, in the photo mask 80, a patterning direction of a pattern 86 provided for IDT forming and reflector forming is slanted with respect to the reference line by an angle equivalent to the angle $\Psi$ by which the quartz wafer 90 is in-plane rotated and the power flow angle PFA. Thus, if the reference line of the photo mask 80 is aligned to the orientation flat 92 of the quartz wafer 90, the scribe line 81 shown in FIG. 5(2) and a pattern 86 shown in FIG. 7(3) are arranged along the direction of the group velocity of the surface acoustic wave in the quartz wafer 90.

Next, a photo process is conducted (step 108). In the process, the resist film provided to the quartz wafer 90 is exposed with the photo mask 80. Then, the resist film is developed by soaking the quartz wafer 90 in developer. By doing this, the pattern corresponding to the IDT and reflector formed on the photo mask 80 is transferred to the resist film. Subsequently, a patterning process is conducted (refer to step 110 and FIG. 7(4)). In the process, the metal thin film 94 is etched with the patterned resist film as a mask. Then, the resist film used as the mask is removed as shown in step 112 (step 112). By doing this, the IDT 34 and the reflectors 36 are formed. Then, a dicing process is conducted as shown in FIG. 7(5). That is, using a diamond saw 96 or the like, the quartz wafer 90 is cut and split along the scribe lines 81 and 82 to be the surface acoustic wave element 50 as shown in FIG. 7(6) (step 114).

By doing this, the surface acoustic wave element 50 made from the quartz plate in which two edges faced each other are along the direction of the group velocity of the surface acoustic wave can be achieved.

Figure 8:
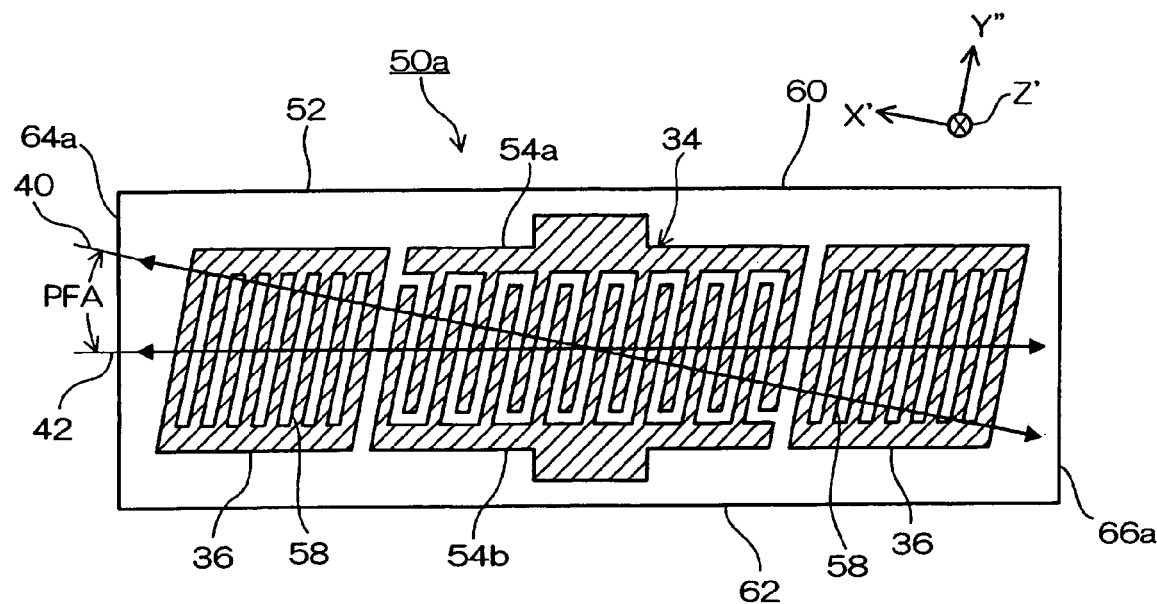
FIG. 8 is a plan view of the surface acoustic wave element of a second embodiment of the present invention.
Figure 9:
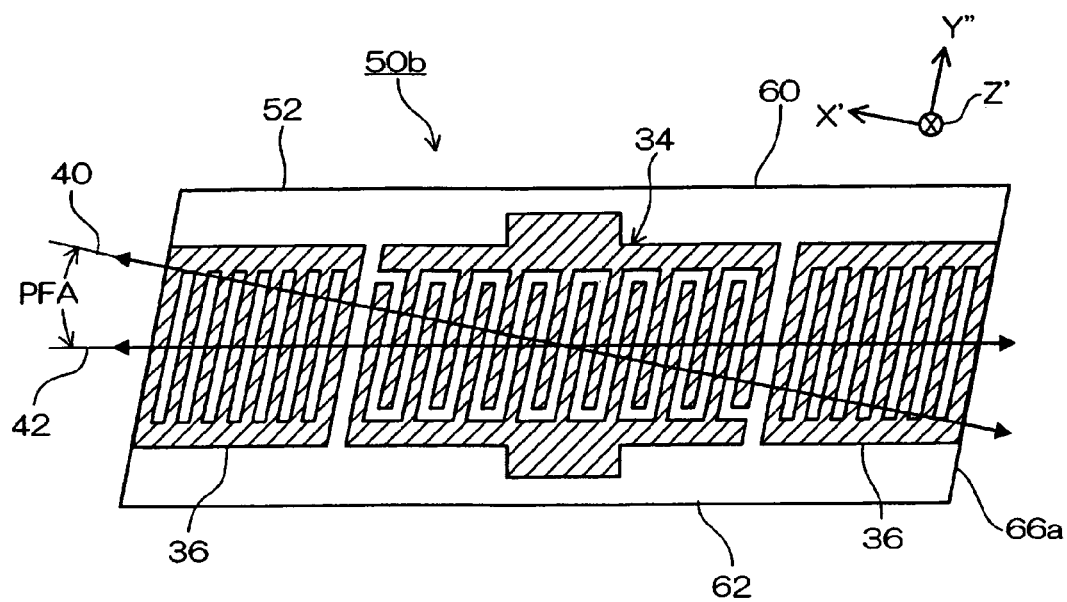
FIG. 9 is a plan view of the surface acoustic wave element of a third embodiment of the present invention.

FIG. 8 is a plan view of the surface acoustic wave element of a second embodiment of the invention. In the surface acoustic wave element 50a of the embodiment, short edges 64a and 66a of the quartz plate 52 are formed in parallel with the conductive strips 58 forming the reflectors 36. Thus, in the quartz plate 52, four edges 60, 62, 64a, and 66a are formed along a pattern defined by the IDT 34 and the reflectors 36 to be a parallelogram. The surface acoustic wave element 50a formed as above mentioned can be smaller than the surface acoustic wave element 50 of the first embodiment and more increase the yield because the outer shape is along the outer shapes of the IDT 34 and the reflectors 36. In addition, in the surface acoustic wave element, the effect of the edge of the quartz plate is being lessened with increasing oscillation frequency to higher frequency. Thus, even though the edges 64a and 66a are crossed at an angle with respect to the direction 42 of the group velocity of the surface acoustic wave, the Q value of the surface acoustic wave element 50a is not much affected. Accordingly, the surface acoustic wave element may be formed as a third embodiment of the invention shown in FIG. 9.

In the surface acoustic wave element 50b of the third embodiment, the sides of the reflector 36 are extended to the edges of 64a and 66a, the sides being opposite from the IDT 34 side. The surface acoustic wave element 50b can reduce its length further shorter. This makes it possible to achieve the downsizing for further increasing the yield per quartz wafer. In addition, the edges 64a and 66a may be perpendicular to the direction 40 of the phase velocity of the surface acoustic wave element.

INDUSTRIAL APPLICABILITY

The surface acoustic wave elements 50, 50a, and 50b of each above-mentioned embodiment can be used for surface acoustic wave devices such like SAW resonators or SAW filters or the like.

What is claimed is:

1. A surface acoustic wave element comprising:
    an in-plane rotated ST cut quartz plate whose cutting angle is expressed as (0°, 113°-135°(40°-49°)) by defining and using Euler angle of ($\phi°,\theta°,\Psi°$);
    an interdigital transducer; and
    a reflector, wherein:
        the interdigital transducer and the reflector that are formed on a surface of the quartz plate are arranged at a slant of a PFA ±3° with respect to a direction of a phase velocity of a surface acoustic wave in the quartz plate;
        the PFA is represented by the following equation:

$PFA=0.374(\theta°-90°)-10.0°$; and first and second opposing edges of the ST cut quartz plate are substantially parallel to a group velocity direction of the surface acoustic wave element.

2. A surface acoustic wave element comprising a quartz plate of which an interdigital transducer is formed on a surface and in which a direction of a phase velocity of a surface acoustic wave and a direction of a group velocity of the surface acoustic wave are different, wherein
    two opposing edges of the quartz plate face each other and are substantially parallel to the direction of the group velocity.

3. The surface acoustic wave element according claim 1, wherein
    four edges of the quartz plate are formed along a pattern defined by the interdigital transducer and the reflector.

4. The surface acoustic wave element according to claim 1, wherein
    the quartz plate includes two edges perpendicular to the direction of the group velocity of the surface acoustic wave.

5. The surface acoustic wave element according to claim 1, wherein
    one side of the reflector is extended to an edge of the quartz plate, the side being opposite to another side facing the interdigital transducer of the reflector.

6. A surface acoustic wave device comprising the surface acoustic wave element according to claim 1.

7. The surface acoustic wave element according claim 2, wherein
    four edges of the quartz plate are formed along a pattern defined by the interdigital transducer and the reflector.

8. A surface acoustic wave element comprising a quartz plate of which an interdigital transducer is formed on a surface and in which a direction of a phase velocity of a surface acoustic wave and a direction of a group velocity of the surface acoustic wave are different, wherein:
    two edges of the quartz plate face each other along the direction of the group velocity; and
    the quartz plate includes two edges perpendicular to the direction of the group velocity of the surface acoustic wave.

9. The surface acoustic wave element according to claim 2, wherein
    one side of the reflector is extended to an edge of the quartz plate, the side being opposite to another side facing the interdigital transducer of the reflector.

* * * * *